(12) United States Patent
Lee et al.

(10) Patent No.: US 9,548,218 B2
(45) Date of Patent: Jan. 17, 2017

(54) THERMAL SURFACE TREATMENT FOR REUSE OF WAFERS AFTER EPITAXIAL LIFT OFF

(71) Applicant: The Regents of the University of Michigan, Ann Arbor, MI (US)

(72) Inventors: Kyusang Lee, Ann Arbor, MI (US); Jeramy Zimmerman, Golden, CO (US); Stephen R. Forrest, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 14/374,390

(22) PCT Filed: Feb. 7, 2013

(86) PCT No.: PCT/US2013/025020
§ 371 (c)(1),
(2) Date: Jul. 24, 2014

(87) PCT Pub. No.: WO2013/119728
PCT Pub. Date: Aug. 15, 2013

(65) Prior Publication Data
US 2014/0370716 A1    Dec. 18, 2014

Related U.S. Application Data

(60) Provisional application No. 61/595,916, filed on Feb. 7, 2012.

(51) Int. Cl.
*H01L 21/324* (2006.01)
*H01L 31/18* (2006.01)
(Continued)

(52) U.S. Cl.
CPC ....... *H01L 21/3247* (2013.01); *H01L 21/3065* (2013.01); *H01L 21/3245* (2013.01);
(Continued)

(58) Field of Classification Search
CPC ............. H01L 31/1896; H01L 21/3247; H01L 21/3065
See application file for complete search history.

(56) References Cited

U.S. PATENT DOCUMENTS 8,932,403 B1 *  1/2015  Li et al. ................. 117/89
2006/0054900 A1  3/2006  Takamoto et al.
(Continued)

FOREIGN PATENT DOCUMENTS

EP         1 635 383 A2    3/2006
WO    WO 2008/132569 A1   11/2008

OTHER PUBLICATIONS

A. van Geelen, et al., "Epitaxial lift-off GaAs solar cell from a reusable GaAs substrate," *Materials Scenes and Engineering*, B45 (1977) pp. 162-171.
(Continued)

*Primary Examiner* — Duy Deo
*Assistant Examiner* — Mahmoud Dahimene
(74) *Attorney, Agent, or Firm* — Finnegan, Henderson, Farabow, Garrett & Dunner, LLP

(57) ABSTRACT

There is disclosed a method of preserving the integrity of a growth substrate in a epitaxial lift-off method, the method comprising providing a structure comprising a growth substrate, one or more protective layers, a sacrificial layer, and at least one epilayer, wherein the sacrificial layer and the one or more protective layers are positioned between the growth substrate and the at least one epilayer; releasing the at least
(Continued)

one epilayer by etching the sacrificial layer with an etchant; and heat treating the growth substrate and/or at least one of the protective layers.

20 Claims, 4 Drawing Sheets

(51) Int. Cl.
    *H01L 21/3065* (2006.01)
    *H01L 33/00* (2010.01)

(52) U.S. Cl.
    CPC ........ *H01L 31/1896* (2013.01); *H01L 33/007* (2013.01); *Y02E 10/50* (2013.01)

(56) References Cited

U.S. PATENT DOCUMENTS

2009/0035534 A1    2/2009  Su et al.
2010/0219509 A1    9/2010  He et al.

OTHER PUBLICATIONS

PCT International Search Report dated Oct. 2, 2013, PCT/US2013/025020.

\* cited by examiner (a)

(b)

THERMAL SURFACE TREATMENT FOR REUSE OF WAFERS AFTER EPITAXIAL LIFT OFF

CROSS-REFERENCE TO RELATED APPLICATION

This application claims the benefit of U.S. Provisional Application No. 61/595,916 filed Feb. 7, 2012, which is incorporated herein by reference in its entirety.

STATEMENT REGARDING FEDERALLY SPONSORED RESEARCH

This invention was made with U.S. Government support under award number W911NF-08-2-0004 awarded by the Army Research Office. The government has certain rights in the invention.

JOINT RESEARCH AGREEMENT

The subject matter of the present disclosure was made by, on behalf of, and/or in connection with one or more of the following parties to a joint university-corporation research agreement: University of Michigan and Global Photonic Energy Corporation. The agreement was in effect on and before the date the subject matter of the present disclosure was prepared, and was made as a result of activities undertaken within the scope of the agreement.

The present disclosure generally relates to methods of making electronic and optoelectronic devices, such as flexible photovoltaic devices, through the use of epitaxial liftoff. In particular, the disclosure relates to preserving the integrity of growth substrates for subsequent reuse.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{sc}$, in Amperes (2) the photovoltage under open circuit conditions, i.e., the open circuit voltage $V_{oc}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{oc}$. When irradiated with its electrical contacts shorted, a PV device generates its maximum possible current, I short-circuit, or $I_{sc}$. When actually used to generate power, a PV device is connected to a finite resistive load and the power output is given by the product of the current and voltage, I×V. The maximum total power generated by a PV device is inherently incapable of exceeding the product, $I_{sc} \times V_{oc}$. When the load value is optimized for maximum power extraction, the current and voltage have the values, $I_{max}$ and $V_{max}$, respectively.

A figure of merit for PV devices is the fill factor, FF, defined as:

$$FF = \{I_{max} V_{max}\} / \{I_{sc} V_{oc}\} \quad (1)$$

where FF is always less than 1, as $I_{sc}$ and $V_{oc}$ are never obtained simultaneously in actual use. Nonetheless, as FF approaches 1, the device has less series or internal resistance and thus delivers a greater percentage of the product of $I_{sc}$ and $V_{oc}$ to the load under optimal conditions. Where $P_{inc}$ is the power incident on a device, the power efficiency of the device, $\eta_P$, may be calculated by:

$$\eta_P = FF^* (I_{sc}^* V_{oc}) / P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions can be fabricated so that they are either n- or p-type. Here n-type denotes that the majority carrier type is the electron. This could be viewed as the material having many electrons in relatively free energy states. Here p-type denotes that the majority carrier type is the hole. Such material has many holes in relatively free energy states. The type of the background, i.e., not photo-generated, majority carrier concentration depends primarily on doping by defects or impurities, either intentional or unintentional. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV structure has traditionally been the p–n junction.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p–n junction to establish an internal field. High-efficiency PV devices are typically produced on expensive, single crystal growth substrates. These growth substrates may include single crystal wafers, which can be used for creating a perfect lattice and structural support for the epitaxial growth of active layers, also known as "epilayers." These epilayers may be integrated into PV devices with their original growth substrates intact. Alternatively, those epilayers may be removed and recombined with a host substrate.

In some instances, it may be desirable to transfer the epilayers to host substrates that exhibit desirable optical, mechanical, or thermal properties. For example, Gallium Arsenide (GaAs) epilayers may be grown on Silicon (Si) substrates. However, the electronic quality of the resulting material may be insufficient for certain electronic applications. Therefore, it may be desirable to preserve the high material quality of the lattice-matched epilayers, while allowing the integration of those epilayers into other substrates. This may be accomplished by a method known as epitaxial liftoff. In epitaxial liftoff processes, epilayers may be "lifted off" growth layers and recombined (e.g., bonded or adhered) to a new host substrate. A lifted-off solar cell with a reflective back contact requires approximately half of the active region thickness to absorb an equivalent amount of incident radiation compared to conventional substrate-based solar cells, reducing materials consumption and growth time of the epitaxial layers.

Although they may provide desirable epitaxial growth characteristics, typical growth substrates can be thick and create excess weight, and the resulting devices tend to be fragile and require bulky support systems. Epitaxial liftoff may be a desirable way to transfer epilayers from their growth substrates to more efficient, light-weight, and flexible host substrates. Given the relative scarcity of typical growth substrates and the desirable characteristics that they impart on resulting cell structures, it may be desirable to recycle and/or reuse growth substrates in subsequent epitaxial growths. Past attempts to reuse growth wafers have resulted in reduced efficiency or have required abrasive "polishing" of the wafer by removing the top several micrometers of material from the wafer.

U.S. Patent Publication No. 2010/0047959 describes a method for selectively freeing an epitaxial layer from a single crystal substrate. The described method includes the deposition of a first buffer layer, an etch stop layer, a second buffer layer, and a separation layer. Above the separation layer, a sequence of semiconductor layers is deposited to form a cell. The method then comprises etching the separation layer, whereby semiconductor layers are pulled away from the substrate and the associated buffer layers and etch stop layer. However, the specification does not describe a method of preparing the liberated substrate for reuse, such as, for example, selectively etching away the buffer layers and/or etch stop layers.

Applicants previously demonstrated protective layer schemes to preserve a growth substrate surface during the ELO process, and selectively etching away protective layers after ELO for subsequent reuse of the growth substrate. In particular, by employing a combination of epitaxial protective layers and materials etchants, the growth substrate surface can be preserved for subsequent epitaxial layer growth, which can enable significant manufacturing cost reductions by reducing the consumption of expensive growth substrates. Applicants previously demonstrated bi-layer protection schemes and materials (e.g. InP-wafer/InGaAs/InP). These schemes and materials are described in U.S. Patent Publication No. 2011/0186910, and the disclosure of the schemes and materials are incorporated by reference herein. Applicants also previously demonstrated one-layer, two-layer, and at least three-layer protective schemes and materials (e.g. GaAs-wafer/InGaP/GaAs/InGaP). The disclosure of these schemes and materials are described in U.S. patent application Ser. No. 13/536,267, and the disclosure of the schemes and materials are incorporated by reference herein.

During protective layer removal, contaminants, particularly large size contaminants, may be difficult to remove. In order to completely remove such contaminants, protective layers are required to be thick enough to lift off the contaminates by under cutting the particulates without damaging the underlying layer. Thick protective layers, however, increase material consumption and growth time. Thus, there remains a need to improve contaminant removal, particularly the removal of large contaminants, to prepare a growth substrate surface for reuse without requiring polishing or other destructive methods of preparing a growth substrate surface. The ability to perform multiple growths from a single parent wafer promise dramatically reduced production costs for high power conversion efficiency solar cells, such as GaAs solar cells.

The present disclosure addresses these needs by at least partially decomposing at least one protective layer. The at least partial decomposition may be accomplished by heat treating the growth substrate and/or at least one protective layer. At least partially decomposing at least one protective layer can remove residues and contaminants, such as arsenic oxide and other large scale residues and contaminants, formed as a result of the ELO and/or protective layer removal process. This combination of growth substrate protective layers and decomposition via heat treatment allow for the preservation of a growth substrate surface for subsequent epitaxial growth.

Thus, there is disclosed a method of preserving the integrity of a growth substrate, comprising:
providing a structure comprising a growth substrate, one or more protective layers, a sacrificial layer, and at least one epilayer, wherein the sacrificial layer and the one or more protective layers are positioned between the growth substrate and the at least one epilayer;
releasing the at least one epilayer by etching the sacrificial layer with an etchant; and
heat treating the growth substrate and/or at least one of the protective layers.

In some embodiments, a method of preserving the integrity of a growth substrate comprises:
providing a structure comprising a growth substrate, a first protective layer, a second protective layer, a sacrificial layer, and at least one epilayer, wherein the sacrificial layer and the first and second protective layers are positioned between the growth substrate and the at least one epilayer;
releasing the at least one epilayer by etching the sacrificial layer with an etchant; and
heat treating the growth substrate and/or at least one of the first and second protective layers.

As used herein, the term "heat treating" refers to providing heat in sufficient measure and duration to at least partially decompose a protective layer.

The foregoing and other features of the present disclosure will be more readily apparent from the following detailed description of exemplary embodiments, taken in conjunction with the attached drawings. It will be noted that for convenience all illustrations of devices show the height dimension exaggerated in relation to the width.

Figure 6:
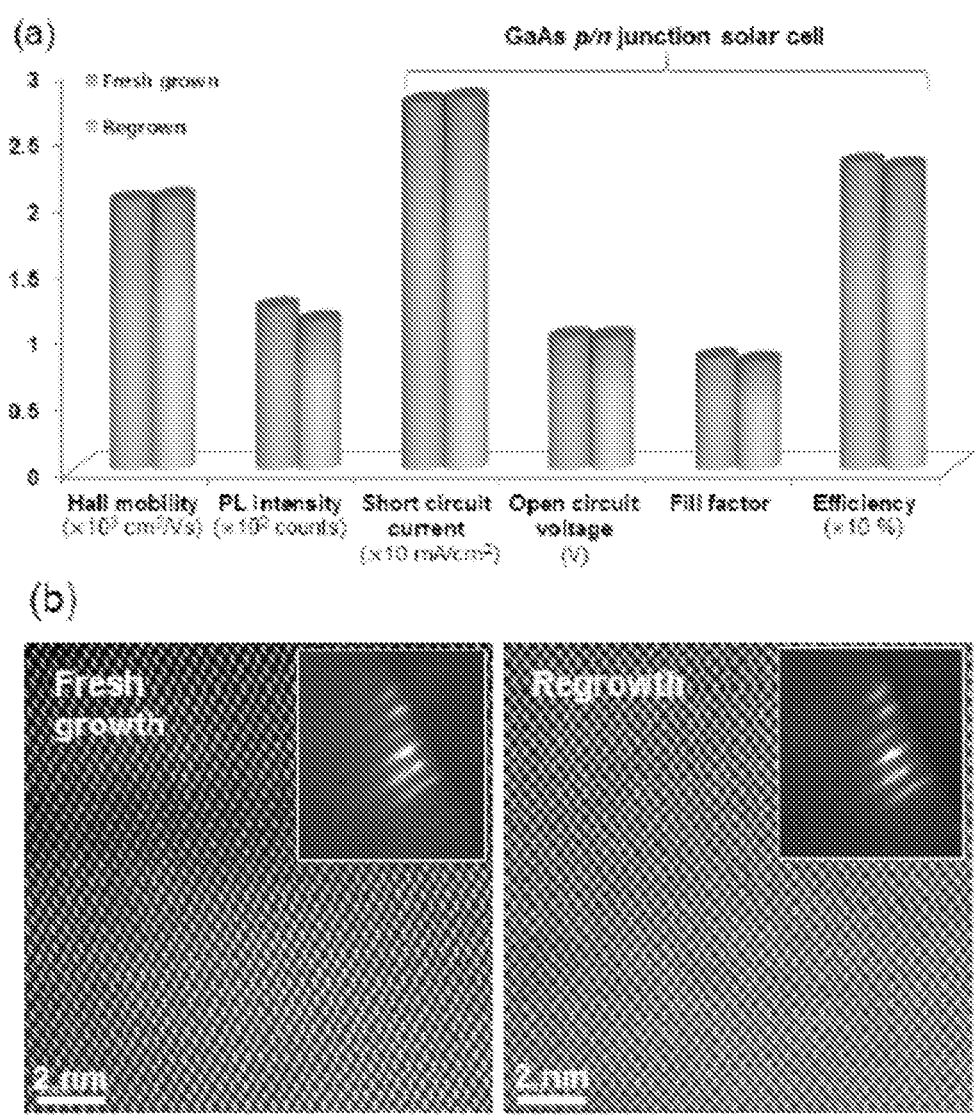

FIG. 6 shows (a) Hall-effect and photoluminescence measurement results of a GaAs epitaxial film, and device performance parameters under 1 sun, AM1.5G simulated solar illumination of GaAs solar cells grown on original and reused wafers using protective layers, (b) atomic resolution cross-sectional transmission electron microscope images of epitaxial GaAs layers grown on original and reused wafers. Inset shows reflection high energy electron diffraction patterns of original and reused wafers.

As used herein, the term "layer" refers to a component whose primary dimension is X-Y, i.e., along its length and width. It should be understood that the term "layer" is not necessarily limited to single layers or sheets of materials. A layer can comprise laminates or combinations of several sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, the terms "wafer" and "growth substrate" can be used interchangeably to mean the same thing.

As used herein, the term "III-V material" may be used to refer to compound crystals containing elements from group IIIA and group VA of the periodic table. More specifically, the term III-V material may be used herein to refer to compounds which are combinations of the group of Gallium (Ga), Indium (In) and Aluminum (Al), and the group of Arsenic (As), Phosphorous (P), Nitrogen (N), and Antimony (Sb). Representative materials may include GaAs, InP, InGaAs, AlAs, AlGaAs, InGaAsP, InGaAsPN, GaN, InGaN, InGaP, GaSb, GaAlSb, InGaTeP, and InSb and all related compounds. The term "Group IV" comprises such semiconductors as Si and Ge in column IV of the periodic chart. Group II-VI comprises such semiconductors as CdS and CdTe, for example, that reside in Groups II and VI of the periodic chart. It is understood that the methods described herein can apply to all of these common classes of semiconductors.

It should be noted that the compounds described herein are named in an abbreviated format. A two component material is considered to be in approximately a 1:1 molar ratio of group III:V compounds. In a three or more component system (e.g. InGaAlAsP), the sum of the group III species (i.e. In, Ga, and Al) is approximately 1 and the sum of the group V components (i.e. As, and P) is approximately 1, and thus the ratio of group III to group V is approximately unity.

Names of compounds (e.g. GaAs, AlInP, GaInP, AlGaAs, GaPSb, AlPSb and combinations thereof for lattice compounds lattice matched to GaAs, or InP, InGaAs, AlInP, GaInP, InAs, InSb, GaP, AlP, GaSb, AlSb and combinations thereof and for compounds lattice matched to InP) are assumed to be in the stoichiometric ratio needed to achieve lattice matching or strain, as inferred from the surrounding text. For example, to lattice match InGaP to InP, the composition is $In_{0.53}Ga_{0.47}As$. AlGaAs (i.e. $Al_xGa_{1-x}As$) is an interesting example because it is nearly lattice matched to GaAs across the entire composition range of $0 \leq X \leq 1$. Additionally, names can be transposed to some degree. For example, AlGaAs and GaAlAs are the same material.

As used herein, the term "etchant selectivity" refers to the rate at which a particular etchant removes a particular material when compared to the rate of etching of another material. Etchant selectivity of X and Y is quantified as the ratio between the etching rate of X to the etching rate of Y for a particular etchant. Accordingly, "highly selective," as used herein, refers to instances where one material is etched rapidly while the other is etched very slowly or not etched at all, such as greater than 10:1, or 100:1, or even 1000:1, or greater.

As used herein, the term "above" references a position in the direction of epitaxial growth.

As stated, a method of preserving the integrity of a growth substrate may comprise:

providing a structure comprising a growth substrate, one or more protective layers, a sacrificial layer, and at least one epilayer, wherein the sacrificial layer and the one or more protective layers are positioned between the growth substrate and the at least one epilayer;

releasing the at least one epilayer by etching the sacrificial layer with an etchant; and heat treating the growth substrate and/or at least one of the protective layers.

In some embodiments, the growth substrate and at least one of the protective layers are heat treated. The heat treatment may be chosen, for example, from furnace heating, such as tube furnace heating, lamp heating, such as quartz lamp heating, laser heating, and strip heating. The heat treatment may be performed in an inert gas or in various levels of vacuum. In some embodiments, the heat treatment may be chosen from a rapid thermal processing (RTP) technique. As one of ordinary skill in the art would appreciate, the temperature and duration of heat treating can vary depending on parameters such as the gas species present, the level of vacuum, the type of material to be at least partially decomposed, the thickness of the layer to be at least partially decomposed, and the desired level of decomposition.

In some embodiments, the heat treatment is chosen from a RTP technique, such as rapid thermal annealing (RTA). As one of ordinary skill in the art would understand, RTA is a technique used to heat a substrate to a desired temperature in the time span of, for example, several seconds to several minutes in an environment where parameters such as gas type, heating temperature, and heating duration are controlled. These parameters may vary depending on, for example, the type of material to be at least partially decomposed, the thickness of the layer to be at least partially decomposed, and the desired level of decomposition. During RTA, once the substrate reaches the desired temperature, it may be held at that temperature for a desired amount of time, such as at least one minute, at least two minutes, or at least 5 minutes, or less than one minute, less than 30 seconds, or even less than 5 seconds. RTA may be performed at a temperature, for example, of up to 400° C., up to 700° C., or greater.

In some embodiments, at least one of the protected layers are heat treated without intentionally heating the growth substrate. In this embodiment, the heat treatment may be chosen from a laser technique, such as pulsed-laser melting.

The methods of the present invention allow for the use of thin protective layers, which decreases materials consumption and reduces growth time. In certain embodiments, protective layer thicknesses may range from 5 nm to 500 nm, such as 10-450, 20-400, 30-350, 40-300, 50-300, 50-250, 50-200, 75-300, 75-250, 75-200, 100-300, and 100-200.

Figure 1:
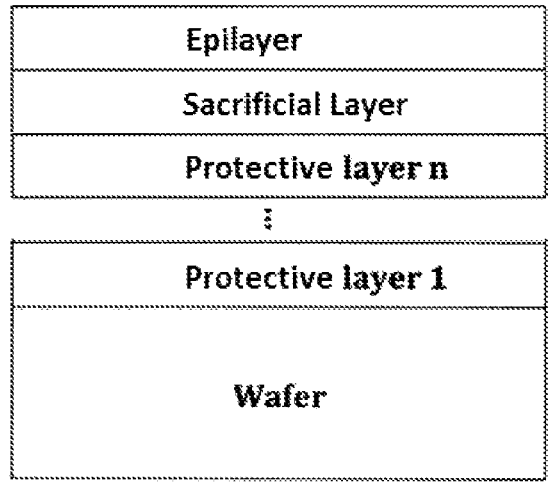
FIG. 1 illustrates a general structure for performing the inventive methods described herein, wherein the structure comprises a growth substrate, one or more protective layers, a sacrificial layer, and at least one epilayer.

In some embodiments, the one or more protective layers may be positioned above the growth substrate, and the sacrificial layer is positioned above the one or more protective layers. FIG. 1 illustrates an example of a general structure for performing the inventive methods. In some embodiments, a one-layer protection scheme may be used. In other embodiments, a two-layer protection scheme may be used. In some embodiments three or more protective layers may be used. As stated above, Applicants previously demonstrated a variety of protective layer schemes and materials in U.S. Patent Publication No. 2011/0186910 and in U.S. patent application Ser. No. 13/536,267, both having been previously incorporated by reference herein for their disclosures of schemes and materials. It should be understood that the inventive methods described herein may be employed with the schemes and materials described in the referenced applications, and that not all of the protective layer schemes and materials for use with the invention will be repeated herein.

The growth substrate may comprise any number of materials, including single crystal wafer materials. In some embodiments, the growth substrate may be chosen from materials that include, but are not limited to, Ge, Si, GaAs, InP, GaN, AlN, GaSb, InSb, InAs, SiC, CdTe, sapphire, and combinations thereof. In some embodiments, the growth substrate comprises GaAs. In some embodiments, the growth substrate comprises InP. In some embodiments, the materials comprising the growth substrate may be doped. Suitable dopants may include, but are not limited to, Zinc (Zn), Mg (and other group IIA compounds), Zn, Cd, Hg, C, Si, Ge, Sn, O, S, Se, Te, Fe, and Cr. For example, growth substrate may comprise InP doped with Zn and/or S.

The one or more protective layers may comprise materials chosen from any III-V materials. In some embodiments, the III-V materials may be chosen, for example, from GaAs, InAlP, InGaP, AlGaAs, AsSb, GaPSb, AlPSb, InP, InGaAs, InAlAs, InAs, InSb, GaP, AlP, GaSb, AlSb, GaAsSb, AlAsSb, AlGaInP, and combinations thereof. In some embodiments, the at least one protective layer to be heat treated may comprise GaAs.

The growth substrate and at least one of the protective layers may comprise the same material. In some embodiments, the growth substrate and the at least one protective layer to be heat treated comprise the same material. In certain embodiments, the same material is GaAs. In any of the embodiments described herein, the protective layer positioned closest to the growth substrate relative to the other protective layers may have a high etch selectivity relative to the growth substrate such that the closely positioned protective layer can be removed with an etchant that stops abruptly on the growth substrate.

The protective layers may comprise lattice matched compounds and/or strained layers, such as under the strain-relaxation critical thickness for strained layers. In certain embodiments, at least one of the protective layers is lattice matched, in other embodiments, at least two of the protective layers are lattice matched, and in further embodiments, at least three of the protective layers are lattice matched. In additional embodiments, at least one of the protective layers is strained, in other embodiments, at least two of the protective layers are strained, and in further embodiments, at least three of the protective layers are strained. In additional embodiments, protective layers may be strain balanced, wherein at least one protective layer is strained positively, and at least one protective layer is strained negatively to partly or fully cancel the effects of the strain in one layer. It is also contemplated that the protective layers can comprise a combination of at least one layer that is lattice matched and at least one layer that is strained.

In some embodiments, a two-layer protection scheme may be used, wherein either one or both protective layers may be heat treated. In other embodiments, a three-layer protection scheme may be used, wherein either one protective layer, two protective layers, or all three protective layers may be heat treated. In other embodiments, more than three protective layers may be used, wherein any one, two, three, four, etc., or all of the protective layers may be heat treated. In any of the embodiments described herein, the at least one protective layer to be heat treated may be positioned furthest above the growth substrate relative to the other protective layers at the time of heat treating. In some embodiments, this protective layer is positioned adjacent to the sacrificial layer.

In some embodiments, the method further comprises etching at least one of the protective layers. In some embodiments, each of the protective layers are selectively etched. Protective layers may be etched before or after heat treating at least one protective layer. In some embodiments, at least one protective layer is etched prior to the heat treatment of at least one protective layer. In some embodiments, at least one protective layer is etched following heat treatment of at least one protective layer. In some embodiments, each of the protective layers are selectively etched after heat treatment of at least one protective layer. In some embodiments, at least one protective layer, such as the protective layer positioned furthest above the growth substrate relative to the other protective layers, may be etched prior to heat treating at least one protective layer. In some embodiments, suitable etchants may be independently chosen from HF, $H_3PO_4$, HCl, $H_2SO_4$, $HNO_3$, $C_6H_8O_7$ (citric acid), $H_2O_2$, $NH_4OH$, $H_2O$ and combinations thereof.

In embodiments where more than one protective layer is heat treated, each heat treated layer may be heat treated separately. For example, in some embodiments, the protective layer positioned furthest above the growth substrate relative to the other protective layers may be optionally heat treated and then etched away following the optional heat treatment. Subsequently, another protective layer, such as the protective layer positioned furthest above the growth substrate relative to the other layers after etching of the previous protective layer, may be optionally heat treated and then etched away following the heat treatment. This process may be repeated as desired to remove contaminants.

In some embodiments, the sacrificial layer comprises AlAs. The sacrificial layer may comprise a super-lattice. In some embodiments, the super-lattice comprises InAs/AlAs or alloys such as AlAsSb, AlGaAs or other predominantly Al-based alloys.

In some embodiments, the etchant for releasing the at least one epilayer comprises HF, $H_3PO_4$, HCl, $H_2SO_4$, $HNO_3$, $C_6H_8O_7$ (citric acid), $H_2O_2$, $NH_4OH$, $H_2O$ and combinations thereof. In certain embodiments, the etchant comprises HF. In some embodiments, the etchant for releasing the at least one epilayer comprises HF, and the at least one protective layer to be heat treated comprises GaAs.

In some embodiments, the at least one epilayer may comprise any material suitable for use in a photosensitive device. The photosensitive devices may include, but are not limited to, photodetectors, photosensors, photoconductors, chemical sensors, biological sensors, and PV devices such as solar cells. The at least one epilayer may be chosen from at least one III-V material. GaAs, InP, and other III-V compounds may be attractive electronic materials for various types of optoelectronic devices, including PV devices. In general, certain III-V compounds may have favorable piezoelectric and optoelectronic properties, high piezoelectronic constants, and a wide variety of electronic bandgaps allowing for the fabrication of heterostructures (relative to Si where heterostructures and lattice matched alloys are uncommon or not available). In some embodiments, the favorable characteristics of certain epilayers may allow for the production of thin, lightweight PV devices. In some embodiments, the resulting PV devices may exhibit a thickness from only a few micrometers thick to several hundred micrometers thick. Exemplary devices may exhibit final thicknesses that include, but are not limited to, about 10 μm to about 150 μm, about 25 μm to about 30 μm, about 10 μm to about 25 μm, and, in some instances, less than 10 μm. In addition, some III-V materials may be deposited as ternary or quaternary "matched alloys" that have lattice constants closely matched to the binary compounds from which they are derived (e.g., $Al_xGa_{a1-x}As$ and GaAs), thus permitting the fabrication of a wide variety of heterostructures that facilitate device performance. Matched alloys of InP may include compounds such as InGaAs, InAlAs, InGaAsP, and InGaAlAs.

In some embodiments, the at least one epilayer may be doped. Suitable dopants may include, but are not limited to, Beryllium (Be), Mg (and other group IIAs), Zn, Cd, Hg, C, Si, Ge, Sn, O, S, Se, and Te. For example, the at least one epilayer may comprise an InGaAs/InP or InGaAs/InP/InGaAs stack, wherein each of the stack materials are lightly doped with a dopant such as Be.

In some embodiments, the at least one epilayer may be part of a cell structure. In some embodiments, the cell structure may represent a fully-developed cell after growth, comprising multiple epilayers of several different semiconductors, contact layers, substrates, and intermediate layers. In some embodiments, the cell structure is a PV cell structure comprised of optically and electrically active semiconductor layers required to convert light to electricity. In some embodiments, the cell structure may simply comprise one or more growth layers, such as a single epilayer, comprising one or more materials suitable for use in PV devices, such as an active layer. In some embodiments, the at least one epilayer may comprise one or more protective layers to protect a device, such as a PV cell, during ELO.

The structure used in the inventive methods described herein may further comprise a buffer layer. In some embodiments, the buffer layer is positioned between the at least one epilayer and the growth substrate. In some embodiments, the buffer layer is positioned between the growth substrate and the one or more protective layers. The growth substrate, the buffer layer, and at least one of the protective layers may comprise the same material. In some embodiments, the growth substrate, the buffer layer, and the at least one protective layer to be heat treated comprise the same material. In some embodiments, the same material comprises GaAs.

Other embodiments of the present disclosure are directed to a method of preserving the integrity of a growth substrate comprising:

providing a structure comprising a growth substrate, a first protective layer, a second protective layer, a sacrificial layer, and at least one epilayer, wherein the sacrificial layer and the first and second protective layers are positioned between the growth substrate and the at least one epilayer;

releasing the at least one epilayer by etching the sacrificial layer with an etchant; and heat treating the growth substrate and/or at least one of the first and second protective layers.

In some embodiments, the first protective layer is positioned above the growth substrate, the second protective layer is positioned above the first protective layer, and the sacrificial layer is positioned above the second protective layer.

The growth substrate, the first and second protective layers, the sacrificial layer, and the at least one epilayer, may comprise materials as described herein.

In some embodiments, either one or both of the first and second protective layers are heat treated. In some embodiments, the first and second protective layers are heat treated separately. In certain embodiments, the second protective layer is heat treated and comprises GaAs. In certain embodiments, the second protective layer is heat treated and comprises GaAs, and the first protective layer is chosen from AlGaInP and InGaP.

The method may further comprise etching the second protective layer. In some embodiments, the method may further comprise selectively etching each of the second and first protective layers. In some embodiments, the second protective layer is etched prior to heat treating the first protective layer. In some embodiments, the second protective layer may be optionally heat treated, and then etched away, prior to optionally heat treating the first protective layer. In some embodiments, suitable etchants may be independently chosen from HF, $H_3PO_4$, HCl, $H_2SO_4$, $HNO_3$, $C_6H_8O_7$ (citric acid), $H_2O_2$, $NH_4OH$, $H_2O$ and combinations thereof.

While the present disclosure discusses wet etching, physical and chemical dry etching techniques can be used to etch layers, thus eliminating the etch selectivity required for wet etching options. Dry etching techniques may include, for example, physical sputter etching and reactive ion etching (RIE), such as inductively coupled plasma RIE.

In some embodiments, the growth substrate and the second protective layer comprise the same material. In certain embodiments, the same material is GaAs. In certain embodiments, the same material is GaAs, and the first protective layer is chosen from AlGaInP and InGaP.

In some embodiments, a buffer layer is positioned between the at least one epilayer and the growth substrate. In some embodiments, the buffer layer is positioned between the growth substrate and the first protective layer. In certain embodiments, the growth substrate, the buffer layer, and the second protective layer comprise the same material. In certain embodiments, the same material is GaAs. In certain embodiments, the same material is GaAs, and the second protective layer is heat treated.

The invention will be further clarified by the following non-limiting examples, which are intended to be purely exemplary of the invention.

EXAMPLES

In this example, the inventive growth substrate protection process was demonstrated using a double-layer protection scheme to allow for multiple growths from a single parent wafer.

Figure 2:
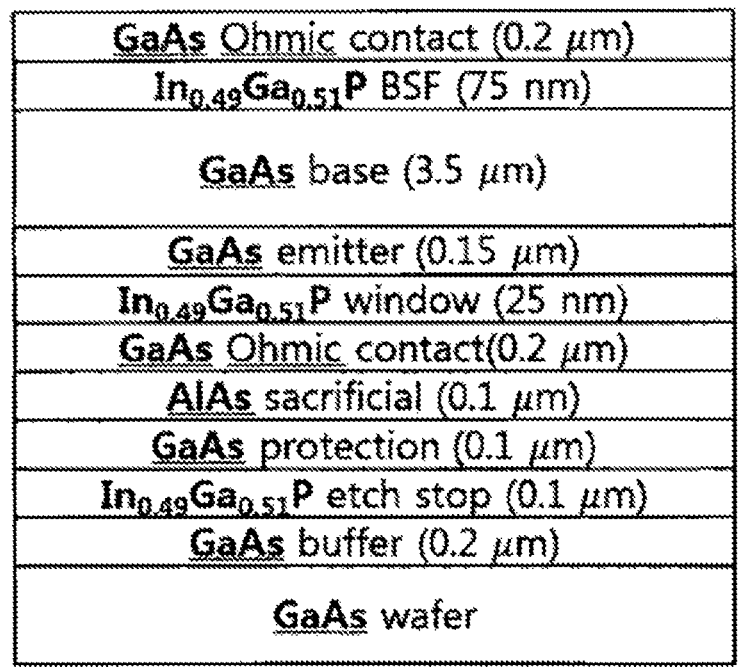
FIG. 2 shows an example of epitaxial layer structures grown on a GaAs substrate in accordance with a double-layer protection scheme.

As shown in FIG. 2, epitaxial layer structures were grown by gas-source molecular beam epitaxy (GSMBE) on Zn-doped (100) p-GaAs substrates. The growths started with a 0.2 μm thick GaAs buffer layer. Then, 0.1 μm lattice matched $In_{0.49}Ga_{0.51}P$ protective etching stop layer was grown, followed by 0.1 μm thick GaAs protection layer. Subsequently, a 0.1 μm thick AlAs sacrificial ELO layer was grown. Then an inverted GaAs solar cell active region was grown as follows: 0.2 μm thick, $5 \times 10^{18}$ $cm^{-3}$ Si-doped GaAs contact layer, 0.025 μm thick, $2 \times 10^{18}$ $cm^{-3}$ Si-doped $In_{0.49}Ga_{0.51}P$ window layer, 0.15 μm thick, $1 \times 10^{18}$ $cm^{-3}$ Si-doped n-GaAs emitter layer, 3.5 μm thick, $2 \times 10^{17}$ $cm^{-3}$ Be-doped p-GaAs base layer, 0.075 μm thick, $4 \times 10^{17}$ $cm^{-3}$ Be-doped $In_{0.49}Ga_{0.51}P$ back surface field (BSF) layer, and a 0.2 μm thick, $2 \times 10^{18}$ $cm^{-3}$ Be-doped p-GaAs contact layer.

Figure 3:
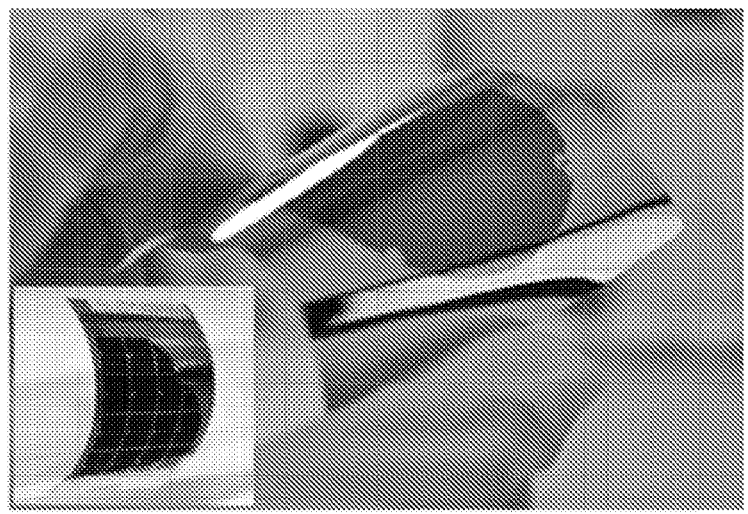
FIG. 3 is an image of a lifted-off half 2-inch-diameter GaAs epitaxial layer by a combination of ELO and cold-weld bonding to a 50 μm thick Kapton® sheet. Inset shows an image of a fabricated GaAs thin-film solar cells on a Kapton® sheet.

After growth, an Ir(150 Å)/Au(8000 Å) contact layer was deposited onto a 50 μm-thick Kapton® sheet and an Au (600 Å) layer was deposited on the GaAs epitaxial layers by electron-beam evaporation. The substrate and plastic sheet were bonded via cold-welding and then immersed into a solution of $HF:H_2O$ (1:10) to perform ELO (i.e. selectively etching the AlAs sacrificial layer). FIG. 3 shows photographs of the lifted-off GaAs solar cell active layer. The thin film was cleaned by plasma etching with $BCl_3$ and Ar gases. Then, it was cut into quarter-wafer pieces for solar cell fabrication.

As described above, a bilayer protection scheme was formed by growth of a protective etch stop layer (0.1 μm thick InGaP) and a protection layer (0.1 μm thick GaAs) to protect the parent GaAs wafer surface during the ELO process. As seen in FIG. 4(b), GaAs exposed to dilute HF can develop a residue or surface contamination that is difficult to etch away cleanly. To alleviate this problem, after completing the ELO, the GaAs protection layer surface was intentionally decomposed by heat treating the GaAs wafer and protective layer using a RTA tool. RTA was performed under $N_2$ conditions. The temperature was ramped up to 500° C. in 30 seconds. The wafer was held at 500° C. for 60 seconds. After the thermal treatment, the majority of large scale contamination was removed.

Figure 4:
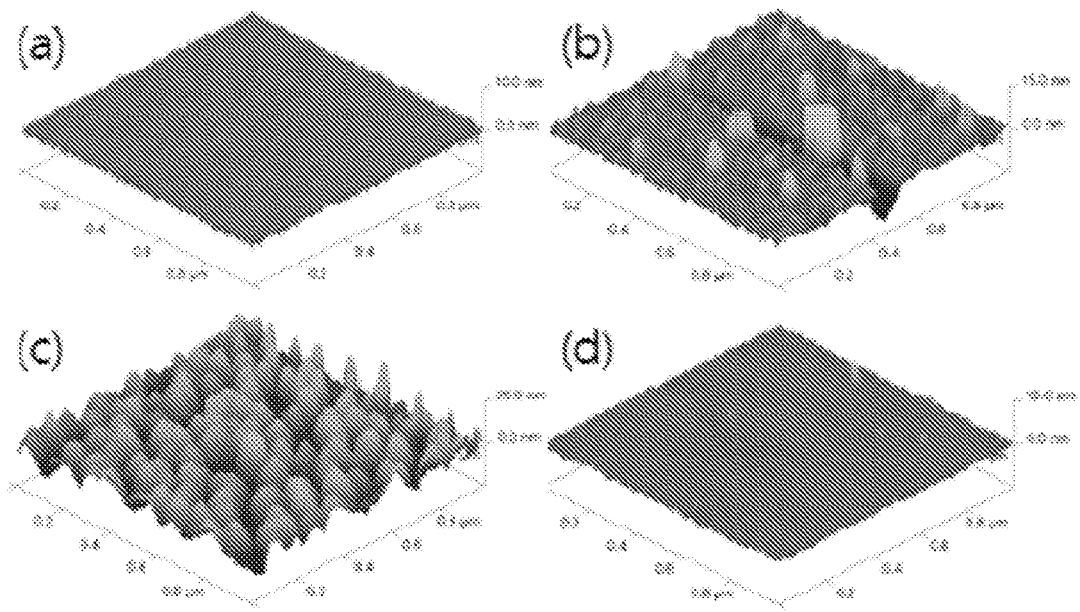
FIG. 4 shows atomic force micrographs of (a) fresh GaAs wafer surface (root mean square roughness of RMS=0.62 nm), (b) the surface of GaAs protection layer after ELO process (RMS=3.37 nm), (c) the decomposed surface of GaAs protection layer after heat treating (RMS=5.09 nm), and (d) GaAs wafer surface after protection layer removal (RMS=0.71 nm).
Figure 5:
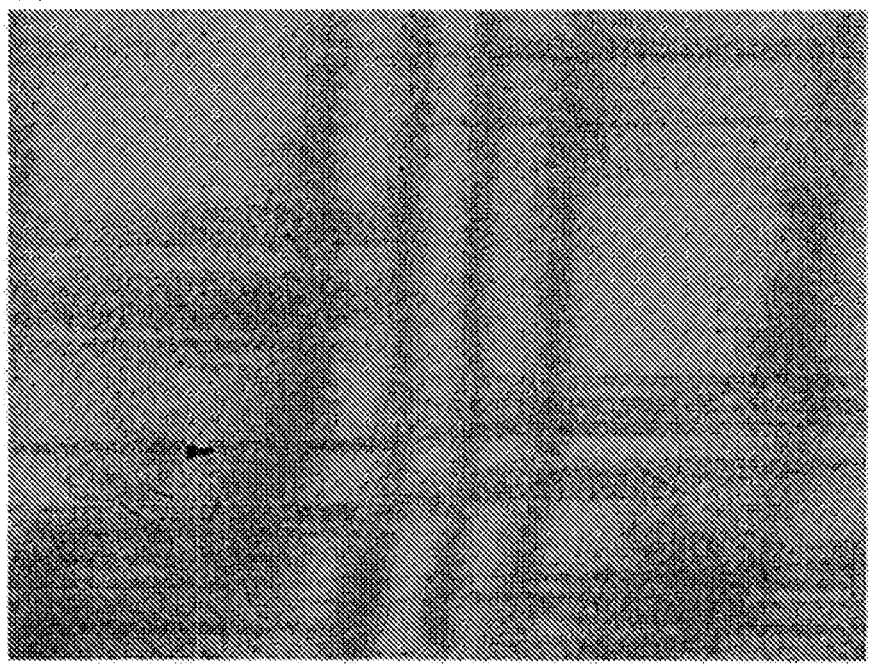
FIG. 5 shows microscopic images of a protective layer surface (a) before and (b) after heat treating by rapid thermal annealing.
Figure 5:
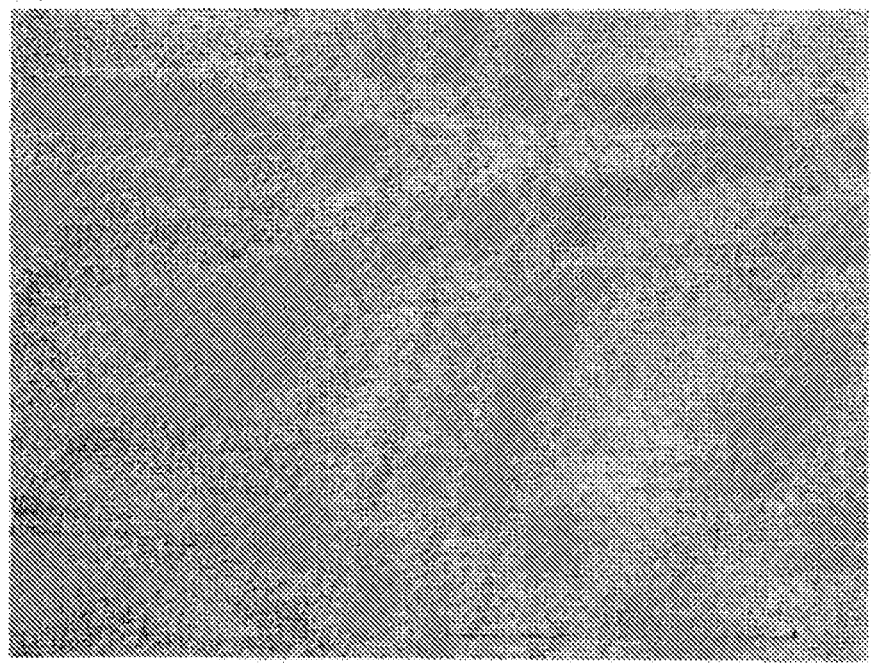

FIG. 5 shows microscopic images of the protection layer surface (a) before and (b) after the RTA treatment. The image indicates that most of the large scale contamination has been removed during the annealing process. An atomic force microscope (AFM) image of the decomposed GaAs surface is presented in FIG. 4(c). After RTA, the protection layer and etch-stop layer were removed by wet etching using $H_3PO_4:H_2O_2:H_2O$ (3:1:25) and $H_3PO_4:HCl$ (1:1), respectively. FIG. 4 shows that surface roughness of the wafer (d) after protection layer removal (root mean square (RMS) roughness of 0.71 nm) was comparable with that of (a) the fresh wafer (RMS roughness of 0.62 nm), indicating nearly identical quality.

To compare the growth quality of original and subsequent epitaxial layers, the ELO process was simulated by exposing the wafer with the protection layers to a dilute solution of 7.5% $HF:H_2O$ for 48 hr. After RTA treatment and epitaxial protection-layer removal, the substrate was loaded back into the GSMBE chamber and degassed. A layer structure was then grown on the original parent substrate with the same structures as that of the reference structure. As shown in FIG. 6, GaAs solar cell performance, Hall-effect, photoluminescence (PL), scanning transmission electron microscopy (STEM) and reflection high energy electron diffraction (RHEED) measurements for GaAs epitaxial layer on both original and reused wafers indicated nearly identical electrical and optical quality of the epitaxial film. The cross sectional STEM images confirmed the nearly perfect crystalline growth for both fresh and regrown epitaxial films (FIG. 6(b)). The RHEED pattern also indicated the identical surface quality for those wafers (inset of FIG. 6(b)). Furthermore, the surface chemistry studied by energy dispersive spectrometry (EDS), and x-ray photoelectron spectrometry (XPS) did not show significant difference between original and reused wafers (not shown). GaAs p/n junction solar cells grown on original and reused wafers exhibited nearly identical performance with power conversion efficiencies of approximately 23% under simulated AM1.5G illumination.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

Other embodiments of the devices and methods described herein will be apparent to those skilled in the art from consideration of the specification and practice. It is intended that the specification and examples be considered as exemplary only, with the true scope of the devices and methods described being indicated by the claims.

What is claimed is:

1. A method of preserving a growth substrate for subsequent epitaxial growth, comprising:
    providing a structure comprising a growth substrate, one or more protective layers, a sacrificial layer, and at least one epilayer, wherein the sacrificial layer and the one or more protective layers are positioned between the growth substrate and the at least one epilayer;
    releasing the at least one epilayer by etching the sacrificial layer with an etchant; and
    heat treating the growth substrate and/or at least one of the protective layers.

2. The method of claim 1, wherein the growth substrate and at least one of the protective layers are heat treated.

3. The method of claim 1, wherein the one or more protective layers are positioned above the growth substrate, and the sacrificial layer is positioned above the one or more protective layers.

4. The method of claim 2, wherein the heat treatment is chosen from furnace heating, lamp heating, laser heating, and strip heating.

5. The method of claim 2, wherein the heat treatment comprises a rapid thermal processing technique.

6. The method of claim 5, wherein the rapid thermal processing technique is rapid thermal annealing.

7. The method of claim 1, further comprising etching at least one of the protective layers.

8. The method of claim 2, further comprising etching at least one of the protective layers prior to the heat treatment.

9. The method of claim 2, wherein the growth substrate comprises a material chosen from Ge, Si, GaAs, InP, GaN, AlN, GaSb, InSb, InAs, and combinations thereof.

10. The method of claim 2, wherein the one or more protective layers comprise materials chosen from III-V materials.

11. The method of claim 2, wherein the at least one protective layer to be heat treated comprises GaAs.

12. The method of claim 9, wherein the one or more protective layers comprise materials chosen from III-V materials.

13. The method of claim 2, wherein the growth substrate and at least one of the protective layers comprise the same material.

14. The method of claim 13, wherein the growth substrate and the at least one protective layer to be heat treated comprise the same material.

15. The method of claim 2, wherein the etchant for releasing the at least one epilayer comprises HF.

16. The method of claim 2, wherein the structure further comprises a buffer layer positioned between the at least one epilayer and the growth substrate.

17. The method of claim 16, wherein the buffer layer is positioned between the growth substrate and the one or more protective layers.

18. The method of claim 17, wherein the growth substrate, the buffer layer, and at least one of the protective layers comprise the same material.

19. The method of claim 18, wherein the growth substrate, the buffer layer, and the at least one protective layer to be heat treated comprise the same material.

20. A method of preserving a growth substrate for subsequent epitaxial growth, comprising:
    providing a structure comprising a growth substrate, a first protective layer, a second protective layer, a sacrificial layer, and at least one epilayer, wherein the sacrificial layer and the first and second protective layers are positioned between the growth substrate and the at least one epilayer;
    releasing the at least one epilayer by etching the sacrificial layer with an etchant; and
    heat treating the growth substrate and/or at least one of the first and second protective layers.

* * * * *